US009832287B2

(12) United States Patent
Sjoholm et al.

(10) Patent No.: US 9,832,287 B2
(45) Date of Patent: Nov. 28, 2017

(54) SYSTEM AND METHOD FOR DYNAMIC HUFFMAN DECODING

(71) Applicant: Comtech EF Data Corp., Tempe, AZ (US)

(72) Inventors: Seth Sjoholm, Moscow, ID (US); Edward Ray Coulter, Moscow, ID (US)

(73) Assignee: Comtech EF Data Corp., Tempe, AZ (US)

( * ) Notice: Subject to any disclaimer, the term of this patent is extended or adjusted under 35 U.S.C. 154(b) by 286 days.

(21) Appl. No.: 14/673,420

(22) Filed: Mar. 30, 2015

(65) Prior Publication Data

US 2015/0281311 A1    Oct. 1, 2015

Related U.S. Application Data

(60) Provisional application No. 61/972,120, filed on Mar. 28, 2014.

(51) Int. Cl.
*H03M 7/40*     (2006.01)
*H04L 29/06*    (2006.01)
*H03M 7/30*     (2006.01)
*H04L 29/08*    (2006.01)

(52) U.S. Cl.
CPC ............. *H04L 69/04* (2013.01); *H03M 7/30* (2013.01); *H03M 7/40* (2013.01); *H04L 29/08072* (2013.01)

(58) Field of Classification Search
CPC ...... H03M 7/40; H03M 7/30; H04L 29/08072
USPC ................ 341/67, 65, 51, 87, 106; 709/219
See application file for complete search history.

(56) References Cited

U.S. PATENT DOCUMENTS 9,252,805 B1 *   2/2016   Abali ................ H03M 7/40

* cited by examiner

*Primary Examiner* — Joseph Lauture
(74) *Attorney, Agent, or Firm* — Booth Udall Fuller, PLC (57) ABSTRACT

A method of decoding a dynamic Huffman encoded data stream comprising receiving, by a processor, one or more input bits of encoded data from among an encoded data stream, searching, by the processor, a ternary content addressable memory (TCAM) for one or more codewords, accessing, by the processor, a plurality of random access memories (RAMs) that comprise the TCAM and have a maximum number of entries that is less than or equal to one half of two to a power of a maximum number of bits to be searched, reading a value from a first level RAM and using the value to index to a second level RAM, and outputting, by the processor, a codeword length and a decoded codeword value from either the first or second level RAM.

26 Claims, 3 Drawing Sheets

SYSTEM AND METHOD FOR DYNAMIC HUFFMAN DECODING

CROSS REFERENCE TO RELATED APPLICATIONS

This document claims the benefit of the filing date of U.S. Provisional Patent Application No. 61/972,120, entitled "System and Method for Dynamic Huffman Decoding" to Seth Sjoholm et al., which was filed on Mar. 28, 2014, the disclosure of which is hereby incorporated entirely by reference herein.

BACKGROUND

1. Technical Field

Aspects of this document relate generally to the fields of data compression and decompression.

2. Background Art

The most difficult part of hardware based decompression of deflate data is decoding blocks of dynamic Huffman coded data. Such blocks have a header that describes two Huffman codes, one for literal and length values and one for distance values. The rest of the block contains codewords encoded with these two codes. The general concept of decompressing dynamic Huffman codes is disclosed in U.S. Pat. No. 7,764,205, which is hereby incorporated by reference in its entirety.

Traditionally, a TCAM-based decoder suffers from logic and routing problems if used on its own. Alternatively, using RAM-based lookup has historically been fast and efficient, but the use of a single RAM results in a prohibitively long loading time.

SUMMARY

Implementations of a method of decoding a dynamic Huffman encoded data stream may comprise receiving, by a processor, one or more input bits of encoded data from among an encoded data stream, searching, by the processor, a ternary content addressable memory (TCAM) for one or more codewords, accessing, by the processor, a plurality of random access memories (RAMs) that comprise the TCAM and have a maximum number of entries that is less than or equal to one half of two to a power of a maximum number of bits to be searched, reading, by the processor, a value from a first level RAM and using the value to index to a second level RAM, and outputting, by the processor, a codeword length and a decoded codeword value from either the first or second level RAM.

Particular implementations may comprise one or more of the following features. The first level RAM may be configured to decode up to N initial input bits of encoded data received and determine whether a match is found. The method may further comprise outputting a codeword length and decoded codeword value from the first level of RAM in response to locating a matching codeword comprising N or fewer bits stored within the first level RAM. The method may further comprise outputting an offset value and a value corresponding to a maximum additional number of bits required to address the second level RAM.

The method may further comprise adding the offset value to the value corresponding to the maximum additional number of bits and indexing the second level RAM for a matching codeword. The method may further comprise outputting a codeword length and decoded codeword value from the second level RAM in response to locating a matching codeword stored within the second level RAM. The method may further comprise loading code data in ascending order to the RAMs prior to the processor attempting to decode the input bits of the encoded data stream.

The method may further comprise loading to the first level RAM, a value indicating that a codeword length comprises N bits or less, a codeword length, and a codeword value comprising a number of clock cycles over which a load signal is active. The method may further comprise loading to the first level RAM, a value indicating whether a codeword length either more than N bits or is less than or equal to N bits, a codeword offset, and a codeword value and loading to the second level of RAM at an address equal to a maximum additional number of bits of the codeword plus the codeword offset, the codeword length and the codeword value.

The method may further comprise writing to a plurality of RAM locations when a maximum codeword length is greater than the codeword length. A plurality of TCAMs may be searched and each TCAM is fed an offset position from the data stream. Any Huffman code present in the data stream at any offset may be decoded and at least one correct Huffman code is subsequently selected. N input bits may be decoded per clock cycle.

Implementations of a system for decoding a dynamic Huffman encoded data stream may comprise a ternary content addressable memory (TCAM) comprising a plurality of random access memories (RAMs) having a maximum number of entries that is less than or equal to one half of two to a power of a maximum number of bits to be searched, the plurality of RAMs organized in levels comprising a first level RAM and a second level RAM and a processor configured to receive one or more input bits of encoded data from among an encoded data stream, search the TCAM for one or more codewords by reading a value from the first level RAM and using the value to index to the second level RAM, and output a codeword length and a decoded codeword value from either the first or second level RAM.

Particular implementations may comprise one or more of the following features. The first level RAM may be configured to decode up to N initial input bits of encoded data received and determine whether a match is found. The processor may be further configured to output a codeword length and decoded codeword value from the first level of RAM in response to locating a matching codeword comprising N or fewer bits stored within the first level RAM. The processor may be further configured to output an offset value and a value corresponding to a maximum additional number of bits required to address the second level RAM. The processor may be further configured to add the offset value to the value corresponding to the maximum additional number of bits and indexing the second level RAM for a matching codeword.

The processor may be further configured to output a codeword length and decoded codeword value from the second level RAM in response to locating a matching codeword stored within the second level RAM. The processor may be further configured to load code data in ascending order to the RAMs prior to the processor attempting to decode the input bits of the encoded data stream. The processor may be further configured to load to the first level RAM, a value indicating that a codeword length comprises N bits or less, a codeword length, and a codeword value comprising a number of clock cycles over which a load signal is active.

The processor may be further configured to load to the first level RAM, a value indicating whether a codeword length either more than N bits or is less than or equal to N bits, a codeword offset, and a codeword value and load to the second level of RAM at an address equal to a maximum additional number of bits of the codeword plus the codeword offset, the codeword length and the codeword value. The processor may be further configured to write to a plurality of RAM locations when a maximum codeword length is greater than the codeword length. The processor may be further configured to search a plurality of TCAMs and feed each TCAM an offset position from the data stream. Any Huffman code present in the data stream at any offset may be decoded and at least one correct Huffman code is subsequently selected. N input bits may be decoded per clock cycle.

Aspects and applications of the disclosure presented here are described below in the drawings and detailed description. Unless specifically noted, it is intended that the words and phrases in the specification and the claims be given their plain, ordinary, and accustomed meaning to those of ordinary skill in the applicable arts. The inventors are fully aware that they can be their own lexicographers if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning Absent such clear statements of intent to apply a "special" definition, it is the inventors' intent and desire that the simple, plain and ordinary meaning to the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

Further, the inventors are fully informed of the standards and application of the special provisions of pre-AIA 35 U.S.C. §112, ¶6 and post-AIA 35 U.S.C. §112(f). Thus, the use of the words "function," "means" or "step" in the Description, Drawings, or Claims is not intended to somehow indicate a desire to invoke the special provisions of pre-AIA 35 U.S.C. §112, ¶6 and post-AIA 35 U.S.C. §112 (f), to define the invention. To the contrary, if the provisions of pre-AIA 35 U.S.C. §112, ¶6 and post-AIA 35 U.S.C. §112(f) are sought to be invoked to define the claimed disclosure, the claims will specifically and expressly state the exact phrases "means for" or "step for, and will also recite the word "function" (i.e., will state "means for performing the function of [insert function]"), without also reciting in such phrases any structure, material or act in support of the function. Thus, even when the claims recite a "means for performing the function of . . . " or "step for performing the function of . . . ," if the claims also recite any structure, material or acts in support of that means or step, or that perform the recited function, then it is the clear intention of the inventors not to invoke the provisions of pre-AIA 35 U.S.C. §112, ¶6 and post-AIA 35 U.S.C. §112 (f). Moreover, even if the provisions of pre-AIA 35 U.S.C. §112, ¶6 and post-AIA 35 U.S.C. §112(f) are invoked to define the claimed disclosure, it is intended that the disclosure not be limited only to the specific structure, material or acts that are described in the preferred embodiments, but in addition, include any and all structures, materials or acts that perform the claimed function as described in alternative embodiments or forms of the invention, or that are well known present or later-developed, equivalent structures, material or acts for performing the claimed function.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, frequency examples, or methods disclosed herein. Many additional components and assembly procedures known in the art consistent with data compression and decompression methodologies are in use with particular implementations from this disclosure. Accordingly, for example, although particular implementations are disclosed, such implementations and implementing components may comprise any components, models, versions, quantities, and/or the like as is known in the art for such systems and implementing components, consistent with the intended operation.

The methods and systems described in this disclosure may utilize one or more of the following hardware components, any one of which may be referred to by the generalized term "processor" throughout the remainder of this disclosure: Field-Programmable Gate Array (FPGA), Programmable Logic Device (PLD), Programmable Integrated Circuit (PIC), Digital Signal Processor (DSP), Application Specific Integrated Circuit (ASIC) or microprocessors using conventional implementation methods known in the art with knowledge of this disclosure.

Decoding of dynamic Huffman encoded data is the most complicated part of the deflate decompression core. The system and methods of this disclosure are directed toward a TCAM-based decoder that uses RAM-based decoding methods that are much more efficient to implement in both FPGA and ASIC implementations. The use of a TCAM based decoder is quick and easy to load with the dynamic code values, but uses lots of logic and creates routing problems if used on its own. Alternatively, using RAM-based lookup is fast and efficient, but using a single RAM results in a prohibitively long loading time. Accordingly, the implementations disclosed herein utilize a plurality of levels of RAM for decoding. In some implementations, a first level RAM decodes the first 8 bits of a codeword and a second level RAM decodes the remaining bits. Due to the limited codeword length (15) and number of codes (288) in a Deflate Huffman code table, these two levels of RAM can be relatively small and efficient and are load in a reasonable amount of time after a block header is decoded. While this disclosure is described in the context of Deflate Huffman codes, it is intended that the disclosed implementation are also applicable to other Huffman codes.

Figure 1:
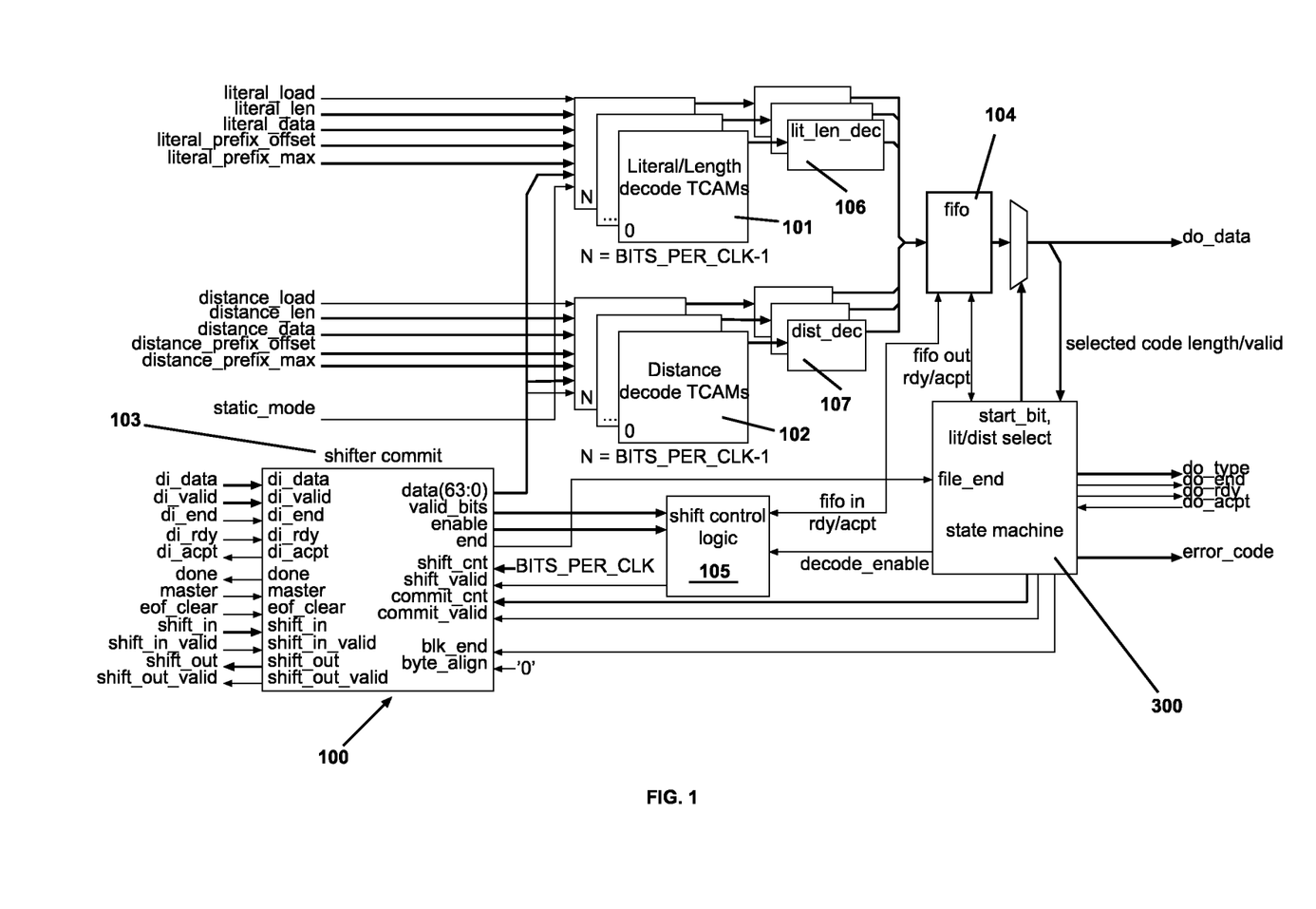
FIG. 1 is a block diagram of an implementation of a system for decoding dynamic Huffman encoded data.

FIG. 1, provides a block diagram of an implementation of a dynamic Huffman decoder 100. As shown in FIG. 1, a plurality of ports are used to define and configure the various components of the system. The following provides an example of port descriptions as shown in FIG. 1 and used in an implementation of a system and method of a dynamic Huffman decoder:

System clk: in std_logic: This is the system clock. In some implementations, only the rising edge is used.

reset: in std_logic: This is an active high synchronous reset.

Data Input di_rdy: in std_logic: This is a data input ready flag and is Active high. When active, this data input ready flag indicates that data is ready on 'di_data', 'di_valid', and 'di_end'.

di_acpt: out std_logic: This is a data input accept flag and is Active high. This data input accept flag indicates that this module can accept data on the 'di_data' bus. It is used in conjunction with 'di_rdy' to transfer data on the rising edge of 'clk'.

di_data: in std_logic_vector(31 downto 0): This is a data input and is valid on the rising edge of 'clk' when 'di_rdy' is active. The value contains 0 to 4 raw bytes depending on the value of 'di_valid'.

di_valid: in std_logic_vector(2 downto 0): This is a data valid count which indicates the number of valid bytes on 'di_data' from 0 to 4. Values of 5 through 7 are invalid.

di_end: in std_logic: This is a file end and is Active high. This filed end is valid on the rising edge of 'clk' when 'di_rdy' is active. When active, the current transfer is the last transfer of the file. The final transfer can happen without data ('di_valid'='000').

Control Ports:

static_mode: in std_logic: This is a static mode and is Active high. The static mode must be valid whenever master is active. When active, it decodes static Huffman encoded data. When inactive, it decodes dynamic Huffman encoded data using the codes loaded from the codeword input ports.

done: out std_logic: This indicates that a block is done and is Active high. It is active for one clock when the module has finished decoding a block of data. This signal can be active on or after the clock when the last 'shift_out' value is output, but not before.

master: in std_logic: This is a master shifter enable and is Active high. When active, this shifter is the master and generates 'shift_out' values. When not active, this shifter is a slave and must update its internal state based on 'shift_in' and 'shift_in_valid'. When 'master' goes active, the module can decode one block. Once the module decodes a block, it must wait for 'master' to go inactive for at least one clock and then active again before decoding another block.

eof_clear: in std_logic: This is the end of file clear and is Active high. When active, the internal end of the file flag is cleared and the shifter can begin reading the next file. This should only be asserted after the entire file has been shifted out.

shift_in: in std_logic_vector(6 downto 0): This is a shift count input. When 'master' is inactive and 'shift_in_valid' is active, then the offset and valid counters must be updated by the count on 'shift_in'.

shift_in_valid: in std_logic: This indicates that a shift count input is valid and is Active high. When active, the value on 'shift_in' is valid and the internal state must be updated if the module is in slave mode.

shift_out: out std_logic_vector(6 downto 0): This is a shift count output. It is valid when 'shift_out_valid' is active. When in master mode, this indicates the size of the codeword read and the number of bits the slaves must update by to keep in sync.

shift_out_valid: out std_logic: This indicates that a shift count output is valid and is Active high. When active, the value on 'shift_out' is valid. This can only be active if 'master' is active.

Literal Code Port:

literal_load: in std_logic: This is a literal load and is Active high. When active, this indicates valid data on the 'literal_len, 'literal_data', 'literal_prefix_offset', and literal_prefix_max' ports. It must not be active while 'master' is active.

literal_len: in std_logic_vector(3 downto 0): This is the literal codeword length. It is valid and transferred on the rising edge of 'clk' when 'literal_load' is active. This indicates the length of the codeword data in bits but does not include any extra bits associated with the code.

literal_ data: in std_logic_vector(14 downto 0): This is literal codeword data. It is valid and transferred on the rising edge of 'clk' when 'literal_load' is active. This indicates the codeword data pattern.

literal_prefix_offset: in std_logic_vector(8 downto 0): This is the literal codeword prefix offset. It is valid and transferred on the rising edge of 'clk' when 'literal_load' is active. If the codeword length is greater than 8, then this is the offset into the second level lookup RAM to store in the first level lookup RAM for the address given by the first 8 bits of 'literal_data' (the codeword prefix).

literal_prefix_max: in std_logic_vector(3 downto 0): This is a literal prefix maximum codeword length. It is valid and transferred on the rising edge of 'clk' when 'literal_load' is active. If the codeword length is 8 or less, this is the maximum codeword length. If the codeword length is greater than 8, this is the maximum codeword length that shares the same prefix (first 8 bits of the codeword).

Distance Code Port:

distance_load: in std_logic: This is the distance load and is Active high. When active, the distance load indicates valid data on the 'distance_len, 'distance_data', 'distance_prefix_ offset', and 'distance_prefix_max' ports. It must not be active while 'master' is active.

distance_len: in std_logic_vector(3 downto 0): This is the distance codeword length. It is valid and transferred on the rising edge of 'clk' when 'distance_load' is active. The distance codeword length indicates the length of the codeword data in bits but does not include any extra bits associated with the code.

distance_data: in std_logic_vector(14 downto 0): This is distance codeword data. It is valid and transferred on the rising edge of 'clk' when 'distance_load' is active. It indicates the codeword data pattern.

distance_prefix_offset: in std_logic_vector(8 downto 0): This is the distance codeword prefix offset. It is valid and transferred on the rising edge of 'clk' when 'distance_load' is active. If the codeword length is greater than 8, this is the offset into the second level lookup RAM to store in the first level lookup RAM for the address given by the first 8 bits of 'distance_data' (the codeword prefix).

distance_prefix_max: in std_logic_vector(3 downto 0): This is the distance prefix maximum codeword length. It is valid and transferred on the rising edge of 'clk' when 'dis-tance_load' is active. If the codeword length is 8 or less, this is the maximum codeword length. If the codeword length is greater than 8, this is the maximum codeword length that shares the same prefix (first 8 bits of the codeword).

Output Data:

error_code: out std_logic_vector(1 downto 0): This is an error code. It is active for one clock. Bit zero indicates an illegal codeword was found. Bit one indicates that an end of file occurred before the end of the block was found.

do_rdy: out std_logic: This is a data output ready flag. It is Active high. When active, this indicates that data is ready on 'do_data', 'do_type', and 'do_end'.

do_acpt: in std_logic: This is the data output accept flag and is Active high. This indicates the downstream module can accept data on the 'do' port and is used in conjunction with 'do_rdy' to transfer data on the rising edge of 'clk'.

do_data: out std_logic_vector(14 downto 0): This is the data output. It is valid on the rising edge of 'clk' when 'do_rdy' is active and contains a literal, a length, a distance, or nothing depending on the value of 'do_type'.

do_type: out std_logic_vector(1 downto 0): This is the data output type. It is valid on the rising edge of 'clk' when 'do_rdy' is active and indicates the type of data on 'do_data' in accordance with the following table:

| Value | Data Type |
|---|---|
| 00 | Literal |
| 01 | Length |
| 10 | Distance |
| 11 | No Data | do_end: out std_logic: This is the block end and is Active high. It is valid on the rising edge of 'clk' when 'do_rdy' is active. When active, the current transfer is the last transfer of the block. The final transfer can happen without data ('do_type'='11').

In some implementations, a system for dymanic Huffman decoding is preferably configured to interface with other modules using the shifter_c0 interface. In some implementations, the system uses a modified shifter called shifter_commit_c0 that allows the module to "look ahead" in the data stream. Literal and distance lookup RAMs may be loaded from the literal and distance code ports starting with code 0 and incrementing on each clock cycle that the load signal is active.

In some implementations, code port load counters may be cleared at the end of a block or when eof_clear is active. When the master is active and static_mode is inactive, two level lookup RAMs may be used to decode literal, length, and distance codes from the data stream. When master and static_mode are both active, static Huffman lookup tables may be used to decode literal, length, and distance codes from the data stream. Some implementations of the system may be able to process N BITS_PER_CLK bits of compressed data per clock or one codeword, whichever is smaller.

The value and type for lengths, literals, and distances are generally output as they are generated and the system may also have the ability to output an end of block with no data. Errors may be reported in encoded data. For example, error_code(1) may be asserted if the end of file is detected before the end of block code is decoded or error_code(0) may be asserted if an illegal codeword is found or no codeword can be decoded.

Some implementations of this module are configured to process the data portion of a dynamic or static Huffman encoded deflate block. For dynamic blocks, an external module may be used to process the header portion and pass information to the system disclosed herein to load the lookup RAMs. The following provides exemplary details of the functionality of some of the various modes:

Dynamic Mode: static mode=0

Before a dynamic block can be processed, in some implementation of the disclosed system and methods, the data to load the lookup RAMs is transferred on the literal and distance code ports.

The decode RAMs may be split into two levels in which the first level RAM may be used for decoding the first N bits of a codeword or the entire codeword if it comprises less than N bits and the second level RAM may be used for decoding the remaining bits. When decoding, the next N bits of the data stream are used as an address into the first level RAM. The value read from the RAM indicates if a codeword of N bits or less was found or in the case in which a codeword of N bits of less is not found, that decoding needs to continue with the second level RAM. The remainder of this disclosure is based on an example in which it is preferable that N is equal to 8 bits, however it is intended that this disclosure be broad enough to cover N being equal to any appropriate number of bits. Thus, in this example, if a codeword of 8 bits or less is found, then the value read from the RAM also include the number of bits in the codeword and the decoded codeword value. If more than 8 bits are needed, then the value read from the first level RAM includes an offset into the second level RAM as well as the maximum number of bits needed to address the second RAM which in this example is 1 through 7. The next 1 through 7 bits from the data stream, as indicated by the output from the first level RAM, are added to the offset and used to address the second level RAM. The value read from the second level RAM give the codeword length and decoded codeword value.

In some implementations, the process of loading the distance RAMs 102 and literal/length RAMs 101 is the same. Distance RAMs 102 and literal/length RAMs 101 may be configured to comprise one or more TCAMs, respectively. The loading information comes in on the codeword ports before the module is enabled for decoding. Codewords are loaded in ascending order starting from 0, at a rate of one for each clock cycle when the load signal is active. In this example, there may be a maximum of 288 literal/length codes and 32 distance codes. It is important to note that literal/length codes 286 and 287 and distance codes 30 and 31 are invalid and will not appear in a valid compressed block, but they can exist in the codeword tree so the system also must be able to handle them arriving on the codeword ports. When loading, if the code length is 0, this indicates that the code is not used and nothing is loaded into the RAMs. If the codeword length is N or less, or in this example, 8 or less, then only the first level RAM is loaded. The codeword is used as the address into the RAM and the value written is a flag indicating that the codeword is 8 bits or less, the codeword length, and the codeword value which is obtained by counting the number of clock cycles over which the load signal was active. The same value may also be written to multiple RAM locations if the maximum codeword length is greater than the codeword length. In this case, the prefix_max comprises the maximum codeword length and the number of RAM locations that need to be written is given by $2^{(\min(8, \text{prefix\_max})-\text{codeword length})}$ and the address is incremented by $2^{(\text{codeword length})}$.

In this example, if the codeword length is greater than 8, both RAM levels will be written to. The first level RAM only needs one location written with the address given by the first 8 bits of the codeword and the data comprising three fields: 1) a flag indicating whether the codeword is greater than 8 bits; 2) the prefix offset; and 3) the value (prefix_max −8). The second level RAM is loaded starting at the address given by the upper (codeword length −8) bits of the codeword+prefix_offset. The address is incremented by 2^(codeword length −8) and the number of locations to write to is 2^(prefix_max-codeword length). The data written to the second level RAM comprises two fields: 1) the codeword length; and 2) the codeword value.

The codeword information is loaded on the codeword ports before the system is enabled, but internally the RAMs may not have completed loading before the system is enabled, in which case the processor waits until loading is complete prior to decoding any data.

Once the system is enabled by 'master' going active, it begins decoding data at a maximum of one codeword per clock. If the codeword length, including extra bits, is greater than N BITS_PER_CLK then the processor waits (codeword length/N BITS_PER_CLK) clock cycles before another codeword can be decoded. In some implementations, the system first looks for literal, length, and end of block codewords. If a length codeword is found, then the next codeword must be a distance. Codewords are translated into literal (in this example, 0-256), length (in this example, 3-258), and distance (in this example, 1-32,768) values, and are output on the do port. Literal codewords have no extra bits and the codeword value is output as the literal value. As provided by this example, codeword 256 is the end of block marker. The following table below of deflate RFC 1951 provides an example which may be used to perform the translation from codewords to length and distance values:

| Length codes: | | |
|---|---|---|
| Code | Extra Bits | Length(s) |
| 257 | 0 | 3 |
| 258 | 0 | 4 |
| 259 | 0 | 5 |
| 260 | 0 | 6 |
| 261 | 0 | 7 |
| 262 | 0 | 8 |
| 263 | 0 | 9 |
| 264 | 0 | 10 |
| 265 | 1 | 11, 12 |
| 266 | 1 | 13, 14 |
| 267 | 1 | 15, 16 |
| 268 | 1 | 17, 18 |
| 269 | 2 | 19-22 |
| 270 | 2 | 23-26 |
| 271 | 2 | 27-30 |
| 272 | 2 | 31-34 |
| 273 | 3 | 35-42 |
| 274 | 3 | 43-50 |
| 275 | 3 | 51-58 |
| 276 | 3 | 59-66 |
| 277 | 4 | 67-82 |
| 278 | 4 | 83-98 |
| 279 | 4 | 99-114 |
| 280 | 4 | 115-130 |
| 281 | 5 | 131-162 |
| 282 | 5 | 163-194 |
| 283 | 5 | 195-226 |
| 284 | 5 | 227-257 |
| 285 | 0 | 258 |

| Distance codes: | | |
|---|---|---|
| Code | Extra Bits | Dist |
| 0 | 0 | 1 |
| 1 | 0 | 2 |
| 2 | 0 | 3 |
| 3 | 0 | 4 |
| 4 | 1 | 5, 6 |
| 5 | 1 | 7, 8 |
| 6 | 2 | 9-12 |
| 7 | 2 | 13-16 |
| 8 | 3 | 17-24 |
| 9 | 3 | 25-32 |
| 10 | 4 | 33-48 |
| 11 | 4 | 49-64 |
| 12 | 5 | 65-96 |
| 13 | 5 | 97-128 |
| 14 | 6 | 129-192 |
| 15 | 6 | 193-256 |
| 16 | 7 | 257-384 |
| 17 | 7 | 385-512 |
| 18 | 8 | 513-768 |
| 19 | 8 | 769-1024 |
| 20 | 9 | 1025-1536 |
| 21 | 9 | 1537-2048 |
| 22 | 10 | 2049-3072 |
| 23 | 10 | 3073-4096 |
| 24 | 11 | 4097-6144 |
| 25 | 11 | 6145-8192 |
| 26 | 12 | 8193-12288 |
| 27 | 12 | 12289-16384 |
| 28 | 13 | 16385-24576 |
| 29 | 13 | 24577-32768 |

In accordance with the above example, during decoding, if the codeword length read from the RAMs is 0, a length code greater than 285 is decoded, or a distance code greater than 29 is decoded, then an invalid codeword error is generated, decoding stops, and master is relinquished. If the end of file flag arrives and the end of block codeword has not been detected, then processing also stops and an unexpected end of file error will be reported. In some implementations, the file is padded with at least 64 bits of pad data after the dynamic block, so if fewer than 64 bits are left, this can be considered an unexpected end of file condition. If no errors are detected, decoding ends when an end of block codeword is decoded from the data stream. Whether or not an error was detected, an end of block transfer must be sent out the do port. This transfer can happen without any valid data on the do port.

Static Mode: static_mode=1

In static mode the decode RAMs are not used and the codewords do not need to be transferred on the codeword port before processing can begin. When the system is enabled and static_mode is 1, the decode RAMs are disabled and instead, the data stream is decoded using static Huffman lookup tables. In one example, distance codewords are stored as a 5 bit number and can be read directly from the data stream. The literal/length codewords are decoded using the following table from the deflate RFC 1951 which is provided here for illustrative exemplary purposes:

| Lit Value | Bits | Codes |
|---|---|---|
| 0-143 | 8 | 00110000 through 10111111 |
| 144-255 | 9 | 110010000 through 111111111 |
| 256-279 | 7 | 0000000 through 0010111 |
| 280-287 | 8 | 11000000 through 11000111 |

One implementation of the system may be built around sets of two level code lookup RAMs. For each of the starting bit offsets 0 to N BITS_PER_CLK−1 there are lookup RAMs for both literal/length codewords and distance codewords. Data is shifted N BITS_PER_CLK bits at a time, so each bit in the compressed block is sent through a literal/length and a distance decoder as a potential starting bit for a codeword.

The outputs from all the lookup RAMs may be converted into literal, length, or distance values and are sent into a FIFO 104. A state machine pulls entries out of the FIFO 104 selecting the valid ones based on the length and type of the previous codeword. As valid codewords are read, the lengths are sent to the commit port on the shifter so they may be shifted out of all the shifters in the core. The valid codewords are then sent out the data port.

Shifter Commit

In some implementations, the shifter commit 103 is a modified version of the shifter_c0 module with two shift inputs, the standard one (shift_valid and shift_cnt) shifts data on the data bus, but unlike a standard shifter doesn't send shift values out the shift_out port to other shifters. Shift values on the commit port (commit_valid and commit_cnt) are sent out the shift_out port. This allows the lookup RAMs to "read ahead" in the data stream decoding potential codewords while only the valid codewords identified after the FIFO 104 are shifted out of all the other shifter modules. At the end of a block, the shift counters controlled by the shift_valid and shift_cnt ports are reset to the values of those controlled by the commit_valid and commit_cnt port effectively putting back the data that was read ahead.

TCAM Implementation using Multiple RAM Levels

Figure 2:
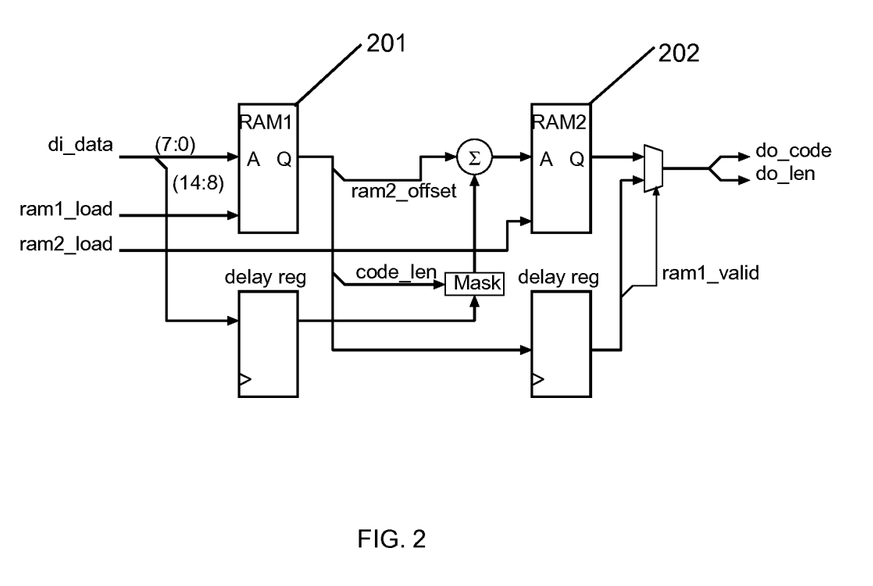
FIG. 2 provides an exemplary configuration of multiple levels of RAM as used to implement a TCAM to decode a codeword according to an implementation of the disclosed system.

FIG. 2, provides an example of how the two levels of lookup RAMs are configured as a TCAM to decode a codeword. As shown, the first level RAM 201 is loaded with different data depending on whether the first N bits of a codeword correspond to a full codeword of N bits or less, or a longer codeword where the second level RAM is needed to complete decoding. For codewords of N bits or less, the upper bit is set to 1 to indicate the output from the first level RAM 201 is all that is needed to decode the codeword. The codeword length (for example, 1 to 8 bits) and the codeword value (for example, 0 to 287) are also stored. For codewords greater than N bits long, the upper bit is set to 0 to indicate that the output from the second level RAM 202 will contain the codeword and codeword length. The rest of the bits have the second level RAM 202 offset, which is the starting offset into the second level RAM for codewords beginning with the given codeword prefix, and the maximum number of bits that need to be used to address the second level RAM 202 for the given prefix (for example, 1 to 7).

In this example, the second level RAM 202 is only loaded for codewords greater than N bits long and will contain the codeword length (for example, 9 to 15 bits when N=8), and the codeword value (for example, 0 to 287).

Using the example in which N is equal to 8, during codeword lookup, bits 7:0 of the data stream are used to address the first level RAM 201. Bits 14:8 are delayed to match the read latency of first level RAM 201. The maximum second level RAM 202 codeword length (1 to 7 for longer codewords) read from first level RAM 201 is used to mask off the upper bits so that only the relevant bits are used to address second level RAM 202. The masked data is then added to the prefix offset read from first level RAM 201 and used to address second level RAM 202. The output read from first level RAM 201 is delayed to match the read latency of second level RAM 202. The upper bit of this delayed value will determine if the delayed output from first level RAM 201 contains the final code and code length (1) or if the output from second level RAM 202 does instead (0).

Load Control

In some implementations, load control generates the write enable and address signals used to load the lookup RAMs. Some data values are loaded into multiple locations in the RAMs and as such, the load control loops over those locations, incrementing the write address as needed. There are two exemplary instances of the load control logic: one for the first level lookup RAMs; and one for the second level lookup RAMs. The load control logic takes a load signal, a count of the number of locations to write, a starting RAM address, an address increment value, and the data to load and outputs RAM write enable, address, and data signals. If the data needs to be loaded to more than one location, the address will be incremented by the specified amount and the count decremented until 0. The same data may be loaded into all locations. In static mode the lookup RAMs are bypassed and static Huffman lookup tables are used instead.

Shift Control

The shift control block 105 on the block diagram represents the logic that determines when to shift data out of the shifter 103. A shift happens when shift_valid is asserted going into the shifter 103. The shift_valid is active when the module is enabled, the FIFO 104 in acpt is active, the state machine indicates decoding is enabled, and the number of valid bits in the shifter is greater than N BITS_PER_CLK+ the maximum codeword size. Data is always shifted N BITS_PER_CLK bits at a time.

Decoders

The literal decoders 106 take as input the literal/length codeword value (for example, 0-285), the codeword length (for example, 1-15 bits), and the raw encoded data which is used to retrieve extra bits. The output is a codeword type (for example, literal, length, or end of block), a final codeword length including extra bits (for example, 1-20 bits), and the literal or length value (in this example, 0-255 for literals, 3-258 for lengths, not used for end of block).

The distance decoders 107 take as input the distance codeword value (for example, 0-29), the codeword length (for example, 1-15 bits), and the raw encoded data which is used to retrieve extra bits. The output is a final codeword length including extra bits (for example, 1-28 bits), and the distance value (for example, 1-32,768).

State Machine

Figure 3:
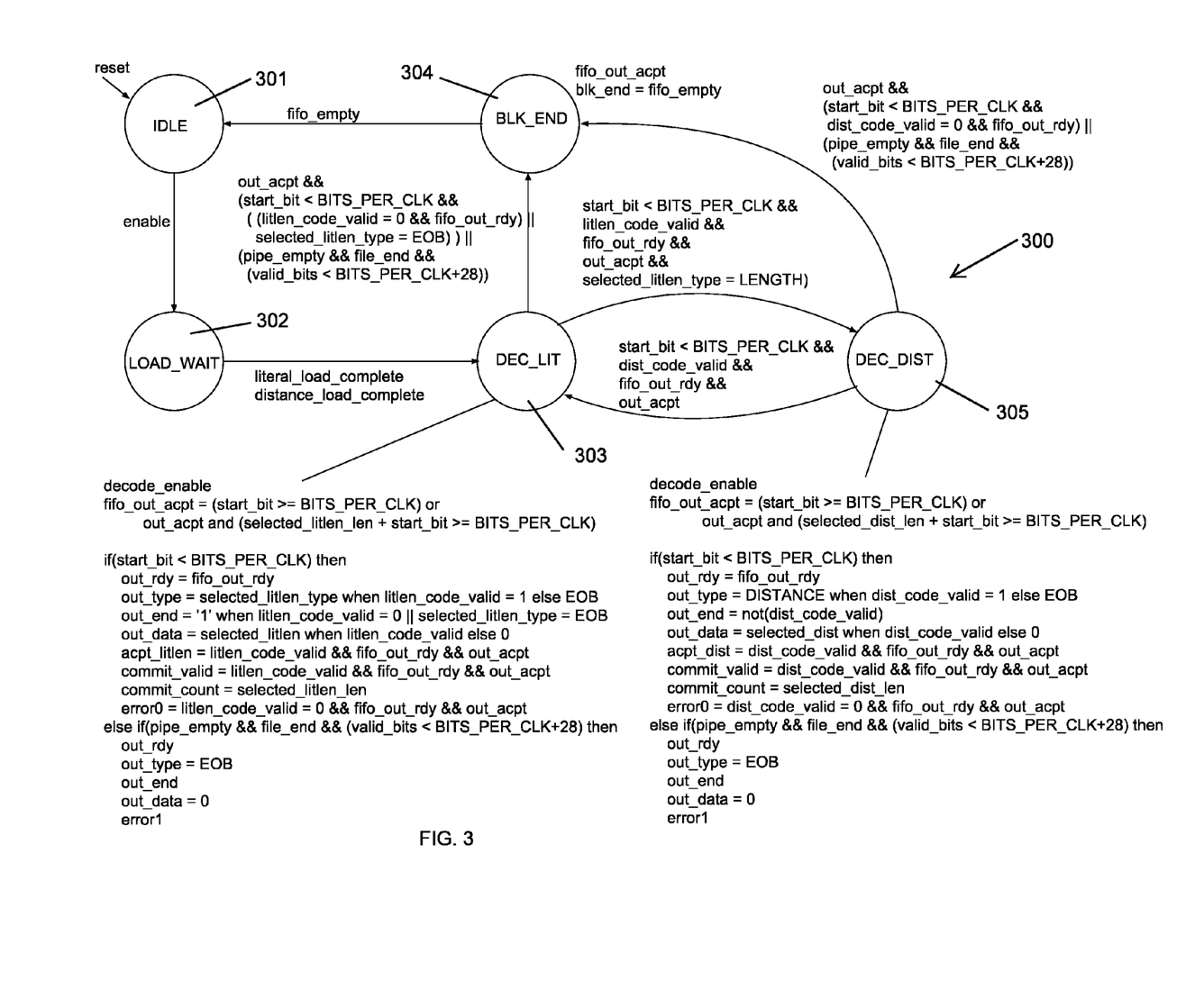
FIG. 3 is a block diagram of a main state machine in accordance with an implementation of a system for dynamic Huffman decoding.

When decoding dynamic Huffman codes, the starting location of a code in the data stream is not known until the previous code is decoded and the length determined. In the past, this has created a tight loop where decoding a codeword each clock was difficult, especially in an FPGA. With the RAM lookup method of Huffman decoding in accordance with the disclosed system and methods, the decoders are small enough they may be replicated N times and all potential codewords decoded in the data stream starting at every bit location at a rate of N decodes per clock cycle. The decoders can be pipelined, the decoded codewords fed into a FIFO 104, and then a state machine 300 can take the codewords out of the FIFO and decide which ones are valid by using the starting bit location and decoded codeword length to decide where the next valid codeword starts. For example, suppose the first codeword starts at bit offset 0 of the first byte. If the first codeword is 6 bits long then the next codeword will start at bit offset 6 of the first byte. If the second codeword is 11 bits long then the third codeword will start at bit offset 1 of the third byte. This allows the design to be better pipelined as well as providing some flexibility in trading off size versus speed by adjusting N up or down for increased throughput or decreased logic usage. FIG. 3 provides an example of a state diagram 300 as detailed below.

The IDLE State 301 is the reset state in which the process waits for 'enable' to become active. In the LOAD_WAIT State 302, once the system is enabled, the state machine 300 must wait for the lookup RAMs to complete loading before decoding can begin.

In the DEC_LIT State 303, a literal/length codeword is decoded. If no valid codeword is found then error0 is asserted, an end of block is sent out, and the process transitions to the BLK_END State 304. If the end of file is reached and there are no more valid codewords, then error 1 is asserted, an end of block an end block is sent out, and the process transitions to the BLK_END State 304. After a length codeword is found, the process transitions to the DEC_DIST State 305. In DEC_DIST State 305, a distance codeword is decoded. If a valid distance codeword is found, it is output and the process returns to the DEC_LIT State 303. If no valid codeword is found, error0 is asseted, an end of block is sent out, and the process transitions to the BLK_END State 304. If the end of file is reached and there are no more valid codewords, then error1 is asserted, an end of block is sent out, and the process transition to the BLK_END State 304. BLK_END State 304 empties out the FIFO, discards any remaining data, and releases shifter control by asserting blk_end for one clock cycle.

In some implementations, it may be advantageous to reduce the design to a single set of decode RAMs. Rather than always shifting N BITS_PER_CLK each time, the first N BITS_PER_CLK bits may be analyzed to determine if the next codeword is less than N BITS_PER_CLK long, and if so, the shift value may be the length of the next codeword. If the next codeword is longer than N BITS_PER_CLK then BITS_PER_CLK is shifted out and on the next clock the output from the first level lookup RAM is used to determine the next shift value (between 1 and N BITS_PER_CLK). If needed, the process may continue on the next clock with the output from the second level lookup RAM. In this manner, codewords are always decoded starting at bit 0 of the shifter data output so only one set of decode RAMs is needed. There may be limits on how large BITS_PER_CLK can be in this case (for example, 8 might be the practical limit). This configuration offers the advantage of potential RAM savings thereby reducing necessary resources when using this modified architecture.

In places where the description above refers to particular implementations systems and methods for dynamic Huffman decoding, it should be readily apparent that a number of modifications may be made without departing from the spirit thereof and that these implementations may be applied to other dynamic Huffman decoding systems and methods.

The invention claimed is:

1. A method of decoding a dynamic Huffman encoded data stream comprising:
    receiving, by a processor, one or more input bits of encoded data from among an encoded data stream;
    searching, by the processor, a ternary content addressable memory (TCAM) for one or more codewords;
    accessing, by the processor, a plurality of random access memories (RAMs) that comprise the TCAM and have a maximum number of entries that is less than or equal to one half of two to a power of a maximum number of bits to be searched;
    reading, by the processor, a value from a first level RAM and using the value to index to a second level RAM; and
    outputting, by the processor, a codeword length and a decoded codeword value from either the first or second level RAM.

2. The method of claim 1, wherein the first level RAM is configured to decode up to N initial input bits of encoded data received and determine whether a match is found.

3. The method of claim 2, further comprising outputting a codeword length and decoded codeword value from the first level of RAM in response to locating a matching codeword comprising N or fewer bits stored within the first level RAM.

4. The method of claim 2, further comprising outputting an offset value and a value corresponding to a maximum additional number of bits required to address the second level RAM.

5. The method of claim 4, further comprising adding the offset value to the value corresponding to the maximum additional number of bits and indexing the second level RAM for a matching codeword.

6. The method of claim 5, further comprising outputting a codeword length and decoded codeword value from the second level RAM in response to locating a matching codeword stored within the second level RAM.

7. The method of claim 1, further comprising loading code data in ascending order to the RAMs prior to the processor attempting to decode the input bits of the encoded data stream.

8. The method of claim 7, further comprising loading to the first level RAM, a value indicating that a codeword length comprises N bits or less, a codeword length, and a codeword value comprising a number of clock cycles over which a load signal is active.

9. The method of claim 7, further comprising:
    loading to the first level RAM, a value indicating whether a codeword length either more than N bits or is less than or equal to N bits, a codeword offset, and a codeword value; and
    loading to the second level of RAM at an address equal to a maximum additional number of bits of the codeword plus the codeword offset, the codeword length and the codeword value.

10. The method of claim 7, further comprising writing to a plurality of RAM locations when a maximum codeword length is greater than the codeword length.

11. The method of claim 1, wherein a plurality of TCAMs are searched and each TCAM is fed an offset position from the data stream.

12. The method of claim 11, wherein any Huffman code present in the data stream at any offset is decoded and at least one correct Huffman code is subsequently selected.

13. The method of claim 12, wherein N input bits is decoded per clock cycle.

14. A system for decoding a dynamic Huffman encoded data stream comprising:
    a ternary content addressable memory (TCAM) comprising a plurality of random access memories (RAMs) having a maximum number of entries that is less than or equal to one half of two to a power of a maximum number of bits to be searched, the plurality of RAMs organized in levels comprising a first level RAM and a second level RAM; and
    a processor configured to:
        receive one or more input bits of encoded data from among an encoded data stream;
        search the TCAM for one or more codewords by reading a value from the first level RAM and using the value to index to the second level RAM; and output a codeword length and a decoded codeword value from either the first or second level RAM.

15. The system of claim 14, wherein the first level RAM is configured to decode up to N initial input bits of encoded data received and determine whether a match is found.

16. The system of claim 15, wherein the processor is further configured to output a codeword length and decoded codeword value from the first level of RAM in response to locating a matching codeword comprising N or fewer bits stored within the first level RAM.

17. The system of claim 15, wherein the processor is further configured to output an offset value and a value corresponding to a maximum additional number of bits required to address the second level RAM.

18. The system of claim 17, wherein the processor is further configured to add the offset value to the value corresponding to the maximum additional number of bits and indexing the second level RAM for a matching codeword.

19. The system of claim 18, wherein the processor is further configured to output a codeword length and decoded codeword value from the second level RAM in response to locating a matching codeword stored within the second level RAM.

20. The system of claim 14, wherein the processor is further configured to load code data in ascending order to the RAMs prior to the processor attempting to decode the input bits of the encoded data stream.

21. The system of claim 20, wherein the processor is further configured to load to the first level RAM, a value indicating that a codeword length comprises N bits or less, a codeword length, and a codeword value comprising a number of clock cycles over which a load signal is active.

22. The system of claim 20, wherein the processor is further configured to:
load to the first level RAM, a value indicating whether a codeword length either more than N bits or is less than or equal to N bits, a codeword offset, and a codeword value; and
load to the second level of RAM at an address equal to a maximum additional number of bits of the codeword plus the codeword offset, the codeword length and the codeword value.

23. The system of claim 20, wherein the processor is further configured to write to a plurality of RAM locations when a maximum codeword length is greater than the codeword length.

24. The system of claim 14, wherein the processor is further configured to search a plurality of TCAMs and feed each TCAM an offset position from the data stream.

25. The system of claim 24, wherein any Huffman code present in the data stream at any offset is decoded and at least one correct Huffman code is subsequently selected.

26. The system of claim 25, wherein N input bits is decoded per clock cycle.

* * * * *